United States Patent

Driskill et al.

[11] Patent Number: 6,064,706
[45] Date of Patent: May 16, 2000

[54] APPARATUS AND METHOD OF DESYNCHRONIZING SYNCHRONOUSLY MAPPED ASYNCHRONOUS DATA

[75] Inventors: Raymond K. Driskill; Michael J. Hanlon, both of Plano; Robert W. Cantwell, Garland; John C. Bellamy, Coppell, all of Tex.

[73] Assignee: Alcatel USA, Inc., Plano, Tex.

[21] Appl. No.: 08/777,855

[22] Filed: Dec. 31, 1996

Related U.S. Application Data

[XX.
[60] Provisional application No. 60/016,621, May 1, 1996.

[51] Int. Cl.[7] .................................................. H04L 7/00
[52] U.S. Cl. ........................... 375/372; 375/226; 370/516
[58] Field of Search .................................... 375/226, 357, 375/363, 371, 372; 370/350, 505, 506, 516, 517, 545; 327/144, 145, 151, 153, 160, 161; 360/26, 51; 365/220, 221; 369/60; 377/66, 78

[56] References Cited

U.S. PATENT DOCUMENTS

| | | | |
|---|---|---|---|
| 4,347,620 | 8/1982 | Black et al. | 375/112 |
| 4,434,498 | 2/1984 | Mathieu | 375/114 |
| 4,716,575 | 12/1987 | Douros et al. | 375/3 |
| 4,791,652 | 12/1988 | McEachern et al. | 375/111 |
| 4,811,340 | 3/1989 | McEachern et al. | 370/102 |
| 5,052,025 | 9/1991 | Duff et al. | 375/118 |
| 5,119,406 | 6/1992 | Kramer | 375/118 |
| 5,131,013 | 7/1992 | Choi | 375/118 |
| 5,200,982 | 4/1993 | Weeber | 375/118 |
| 5,245,636 | 9/1993 | Sari et al. | 375/372 |
| 5,268,935 | 12/1993 | Mediavilla et al. | 375/118 |
| 5,268,936 | 12/1993 | Bernardy | 375/118 |
| 5,274,681 | 12/1993 | Yamada et al. | 375/372 |
| 5,289,507 | 2/1994 | Upp | 375/372 |
| 5,297,180 | 3/1994 | Upp et al. | 375/363 |
| 5,311,511 | 5/1994 | Reilly et al. | 370/84 |
| 5,337,315 | 8/1994 | Ehrlich | 370/505 |
| 5,337,334 | 8/1994 | Molloy | 375/118 |
| 5,339,338 | 8/1994 | Elliott | 375/118 |
| 5,343,476 | 8/1994 | Urbansky | 370/102 |
| 5,357,514 | 10/1994 | Yoshida | 370/102 |
| 5,367,545 | 11/1994 | Yamashita et al. | 375/118 |
| 5,402,452 | 3/1995 | Powell et al. | 375/372 |
| 5,457,717 | 10/1995 | Bellamy | 375/372 |
| 5,621,775 | 4/1997 | Etienne | 375/372 |
| 5,761,203 | 6/1998 | Morales | 370/418 |
| 5,781,597 | 7/1998 | Owen, III et al. | 375/372 |
| 5,793,824 | 8/1998 | Burch et al. | 375/372 |

FOREIGN PATENT DOCUMENTS

| | | | |
|---|---|---|---|
| 9316535 | 8/1993 | WIPO | H04J 3/06 |
| 9316536 | 8/1993 | WIPO | H04J 3/06 |

*Primary Examiner*—Stephen Chin
*Assistant Examiner*—Jeffrey W. Gluck
*Attorney, Agent, or Firm*—Baker & Botts, L.L.P.

[57] ABSTRACT

A digital desynchronizer (10) includes an elastic store unit (12) that receives a synchronously mapped asynchronous data signal (14) and outputs asynchronous output data over an asynchronous output data signal (20) in response to an output clock signal (22). The output clock signal (22) is generated by a digitally controlled oscillator (24). The digitally controlled oscillator (24) receives a speed up signal (28) and a slow down signal (30) from a jitter accumulator (26) in order to adjust the clock rate of the output clock signal (22). The jitter accumulator (26) compares retimed read address information (32) to write address information (34) from the elastic store unit (12), subtracts an initial bias, adds the result to any previous sum, and compares this final result to programmable threshold levels in order to determine whether or not to assert the speed up signal (28) or the slow down signal (30). The clock rate of the output clock signal (22) is adjusted by a speed up factor, a slow down factor, or a nominal factor in response to the comparison of the read address information (32) and the write address information (34). The jitter accumulator (26) has programmable thresholds comprised of a lower threshold signal (72) and an upper threshold signal (76) to establish the rate of integration of the incoming jitter or wander. The asynchronous output data thus has a programmable logarithmically integrated frequency response.

18 Claims, 5 Drawing Sheets

APPARATUS AND METHOD OF DESYNCHRONIZING SYNCHRONOUSLY MAPPED ASYNCHRONOUS DATA

RELATED PATENT APPLICATION

This application claims the benefit of U.S. Provisional Application No. 60/016,621, filed on May 1, 1996.

TECHNICAL FIELD OF THE INVENTION

The present invention relates in general to telecommunications signal processing and more particularly to a digital desynchronizer and method.

BACKGROUND OF THE INVENTION

Conventional digital desynchronizers have hardened or fixed tolerances on jitter leakage within the system and thus require a tighter restriction around a fixed leakage rate with fixed thresholds when accumulating the jitter. Such restriction results in an output that, though may be within a desired specification requirement of the system, produces output data that cannot have programmability to the rate of smoothness or has a method of programming the amount of smoothness. Further, conventional digital desynchronizers are not adaptable in response to changes in standards and would have to be redesigned to meet such changes. Therefore, it is desirable to have a digital desynchronizer that produces smooth outputs and can adjust to changes in standards or system requirements without significant redesign effort.

SUMMARY OF THE INVENTION

From the foregoing, it may be appreciated that a need has arisen for a dynamically programmable digital desynchronizer that can leak out accumulated jitter caused by asynchronous data being mapped into a synchronous data stream in order to provide smooth asynchronous data therefrom. In accordance with the present invention, a digital desynchronizer and method are provided that substantially eliminate or reduce disadvantages and problems associated with conventional desynchronizer techniques.

In accordance with an embodiment of the present invention, there is provided a digital desynchronizer that includes an elastic store unit operable to receive synchronously mapped asynchronous data. The elastic store unit generates asynchronous output data from the synchronously mapped asynchronous data in response to an output clock signal generated by a digitally controlled oscillator. A clock rate of the output clock signal can be adjusted by a jitter control signal generated by a programmable jitter accumulator. This allows the asynchronous output data provided by the elastic store unit to have a logarithmic frequency response.

The present invention provides various technical advantages over conventional desynchronizer techniques. For example, one technical advantage is to dynamically adjust the output clock signal in response to the accumulation of jitter. Another technical advantage is to provide asynchronous output data with a logarithmic frequency response. Yet another technical advantage is to provide programmable threshold ranges in order to adjust the logarithmic frequency response of the asynchronous output data. Other technical advantages are readily apparent to one skilled in the art from the following figures, description, and claims.

BRIEF DESCRIPTION OF THE DRAWINGS

For a more complete understanding of the present invention and the advantages thereof, reference is now made to the following description, taken in conjunction with the accompanying drawings, wherein like reference numerals represent like parts, in which.

DETAILED DESCRIPTION OF THE INVENTION

Figure 1:
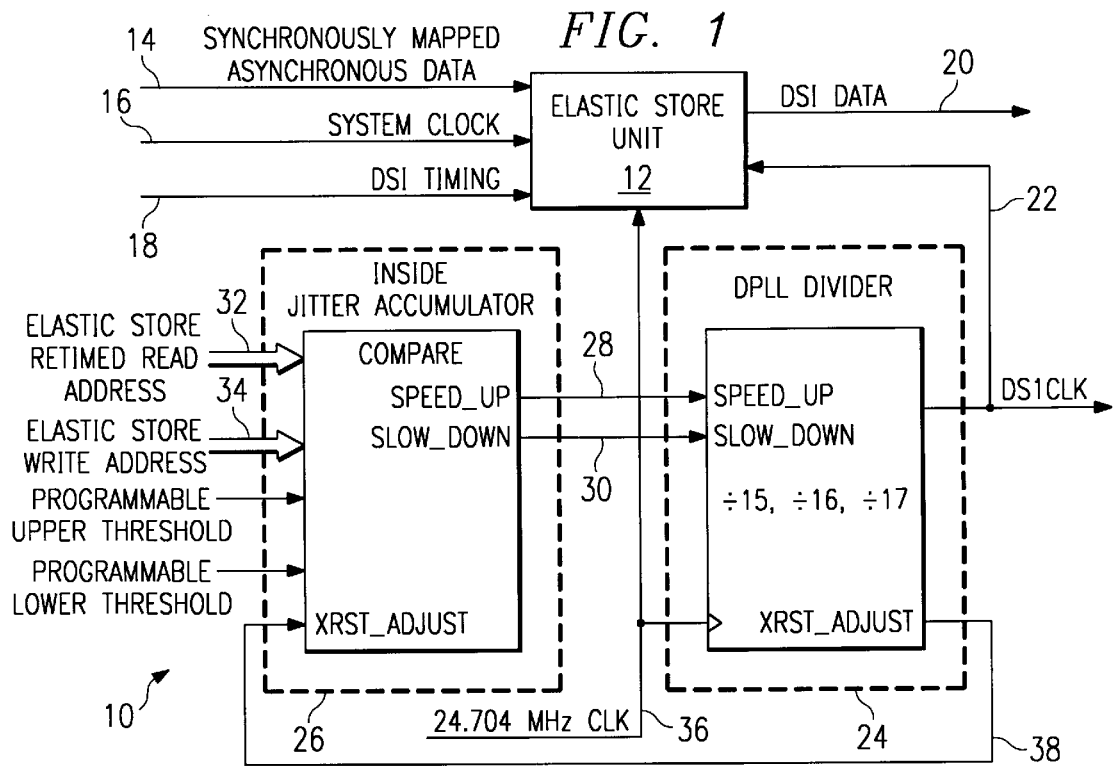
FIG. 1 illustrates a block diagram of a digital desynchronizer.

FIG. 1 is a block diagram of a digital desynchronizer 10. Digital desynchronizer 10 includes an elastic store unit 12 that receives and stores synchronously mapped asynchronous data carried by a synchronously mapped asynchronous data signal 14. The synchronously mapped asynchronous data is stored within elastic store unit 12 in response to a system clock signal 16. Elastic store unit 12 generates an asynchronous output data signal 20 in response to an output clock signal 22 generated by a digitally controlled oscillator 24. A clock rate of output clock signal 22 is controlled by a jitter accumulator 26 that generates jitter control signals in the form of a speed up signal 28 or a slow down signal 30. Speed up signal 28 and slow down signal 30 adjust the clock rate of output clock signal 22 in response to a comparison of retimed read address information 32 and write address information 34 of elastic store unit 12 with respect to programmable upper and lower threshold levels. The clock rate of output clock signal 22 is determined from a reference clock signal 36, in this example having a clock rate of 24.704 MHz, as adjusted if necessary by speed up signal 28 and slow down signal 30. Digitally controlled oscillator 24 generates a reset signal 38 to de-assert speed up signal 28 or slow down signal 30 after one of them has been asserted to adjust the clock rate of output clock signal 22 for one clock period.

Figure 2:
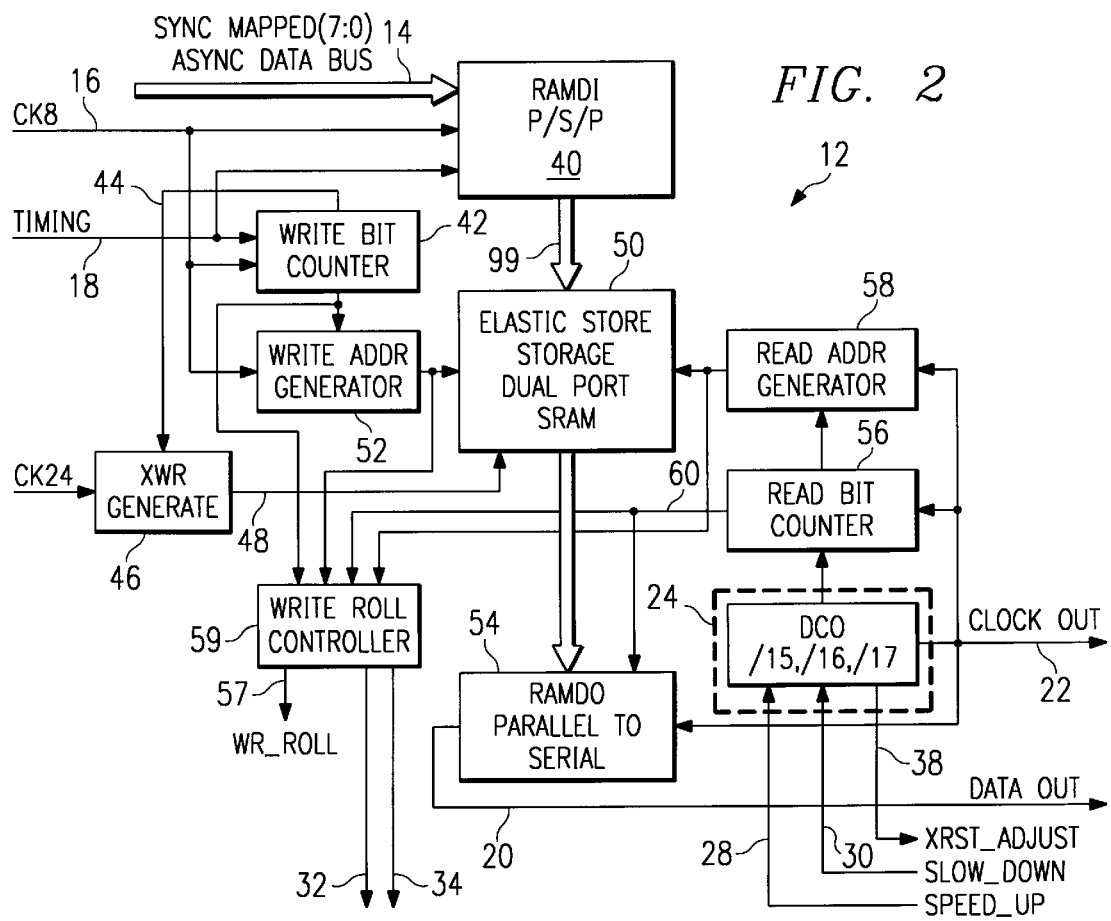
FIG. 2 illustrates a block diagram of an elastic store unit and digitally controlled oscillator for the digital desynchronizer.

FIG. 2 is a block diagram of elastic store unit 12 and digitally controlled oscillator 24. Synchronously mapped asynchronous data signal 14 is received in parallel, serially processed for stuffing, destuffing, or no changes and then put back in parallel form by an input register 40 in response to system clock signal 16. System clock signal 16 is based on the synchronous clock signaling for the system within which lies digital desynchronizer 10. Overhead information is extracted from the synchronously mapped asynchronous data resulting in a data signal 99 which contains only the information bits. Stuffing/destuffing control is managed by overhead interpretation and performed by timing signal 18 which controls write bit counter 42. Write bit counter 42 counts the number of valid bits stored within input register 40. When write bit counter 42 reaches its full count, a counter full signal 44 is provided to a write generate unit 46. Write generator unit 46 provides a write enable signal 48 to a storage unit 50 to allow for storing a full address of data at a location determined by a write address generator 52. After data is placed in storage unit 50, write bit counter 42 is reset to zero and write address generator 52 increments to the next address. For the example shown, storage unit 50 is an 8×9 dual port static random access memory that stores eight addresses having nine bits worth of data each.

Data is read out from storage unit 50 into a parallel to serial shift register 54. A read bit counter 56 keeps track of the number of valid bits left to be shifted out serially by parallel to serial shift register 54. When read bit counter 56 reaches its target level, a read address generator 58 is incremented to the next address and a latch signal 60 places the nine bit parallel data into parallel to serial shift register 54. Parallel to serial shift register 54 shifts the newly loaded nine bit data onto asynchronous output data signal 20 in response to output clock signal 22. Read bit counter 56 is incremented for each bit of asynchronous output data signal 20 shifted out. Read bit counter 56, read address generator 58, and parallel to serial shift register 54 operate off of output clock signal 22.

Digitally controlled oscillator 24 generates output clock signal 22 with the same frequency as the frequency of the embedded data within the synchronously mapped asynchronous data signal 14. Stuff bits in the overhead of the synchronously mapped asynchronous data carry the information to properly regenerate output clock signal 22. To filter out momentary changes in output clock signal 22, the stuff bits cause a gradual change to the fill level of storage unit 50. The fill level of storage unit 50 is measured by comparing retimed read address information 32 and write address information 34. Retimed read address information 32 is a retimed combination of the values in read address generator 58 and read bit counter 56. Write address information 34 is a combination of the values of write bit counter 42 and write address generator 52 and the status of a write roll signal 57. Write roll signal 57 is generated by a write roll controller 59 that determines when the write address for storage unit 50 has rolled over to the beginning of its address sequence. The regeneration of output clock signal 22 is performed by a digital phase lock loop within digitally controlled oscillator 24 in order to produce a smooth clock. Jitter accumulator 26 is utilized to determine when the difference between retimed read address information 32 and write address information 34 is beyond programmable threshold limits.

The voltage controlled oscillator function of digitally controlled oscillator 24 is performed by programmable speed up factor, nominal factor, or slow down factor divides. Digitally controlled oscillator 24 receives a speed up signal 28 or a slow down signal 30 from jitter accumulator 26. Digitally controlled oscillator 24 performs a speed up factor divide on reference clock signal 36 for a speed up condition and a slow down factor divide on reference clock signal 36 for a slow down condition. Normal operation would use a nominal factor divide and occurs when neither speed up signal 28 nor slow down signal 30 are asserted. Digitally controlled oscillator 24 generates reset signal 38 to inform jitter accumulator 26 to de-assert speed up signal 28 or slow down signal 30 after use. Jitter accumulator 26 operates off of system clock signal 16, thus requiring the use of a retimed reset signal 38. Reset retiming is performed for metastability reasons internal to jitter accumulator 26.

A frequency adjustment of output clock signal 22 occurs for one clock cycle, and no other adjustment occurs until the next 125 microsecond frame. In this manner, a smooth output clock signal 22 is generated from digitally controlled oscillator 24. As adjustments are leaked out, a smaller jitter sum remains in jitter accumulator 26 and thus a logarithmic leak rate is achieved by maximum smoothness without endangering the elastic store's over/under flow potential. Whenever an adjustment is made, 1/16th of output clock signal 22 is leaked out. Sixteen adjustments are required to completely leak out an entire received stuff/destuff bit which was processed by input register 40.

Figure 3:
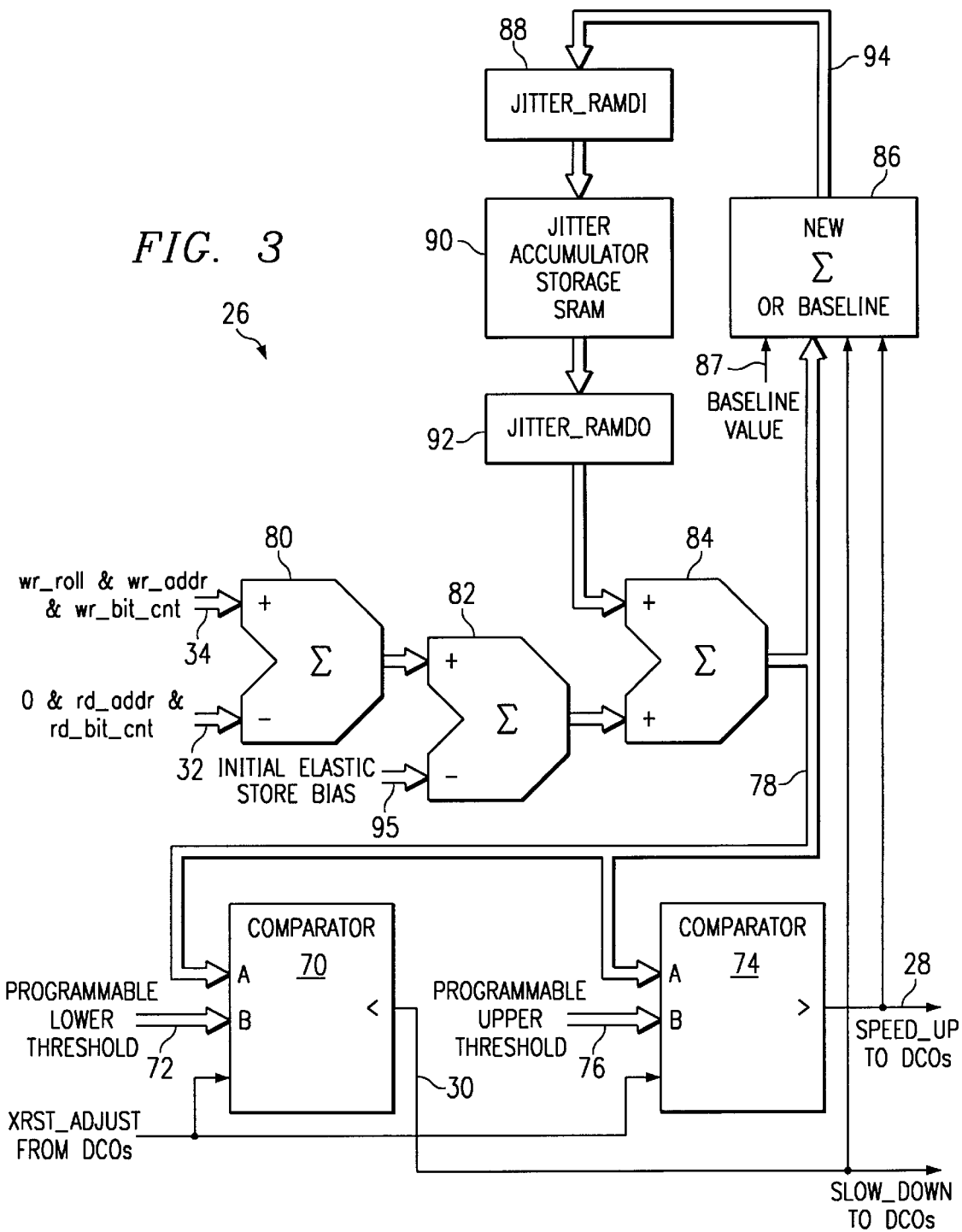
FIG. 3 illustrates a block diagram of a jitter accumulator for the digital desynchronizer.

FIG. 3 is a block diagram of jitter accumulator 26. Jitter accumulator 26 includes a first comparator 70 that receives a dynamically programmable lower threshold signal 72 and a second comparator 74 that receives a dynamically programmable upper threshold signal 76. First comparator 70 and second comparator 74 also receive an accumulated jitter signal 78 generated by a first summer 80, a second summer 82, and a third summer 84. First comparator 70 generates slow down signal 30 in response to accumulated jitter signal 78 falling below lower threshold signal 72. Second comparator 74 generates speed up signal 28 in response to accumulated jitter signal 78 exceeding upper threshold signal 76.

Jitter accumulator 26 also includes a multiplexer 86 that receives a baseline value 87, accumulated jitter signal 78, speed up signal 28, and slow down signal 30 in order to determine whether the value of accumulated jitter signal 78 or the base line value should be stored in the memory system of jitter accumulator 26. The memory system of jitter accumulator 26 includes a jitter input register 88, a jitter storage memory 90, and a jitter output register 92. Storage memory 90 in the memory system of jitter accumulator 26 may be capable of holding jitter values for a plurality of elastic store units 12.

Jitter accumulator 26 sums the low frequency incoming service offset, wander, and jitter components and subsequently slowly and smoothly leaks these frequency components out over time. High frequency jitter components are absorbed by elastic store unit 12, leaving the low frequency jitter components to be handled by jitter accumulator 26. Jitter accumulator 26 has programmable upper and lower threshold boundaries that are used to control the leaking. A leak is performed any time a jitter sum, the amount of accumulated jitter calculated by jitter accumulator 26, has extended beyond the programmable threshold boundaries established by lower threshold signal 72 and upper threshold signal 76. In this manner, the step function transient experienced by digital desynchronizer 10 is leaked out over a longer period of time than it was received, leading to a logarithmically integrated frequency response of the outbound data stream on asynchronous output data signal 20. The programmable nature of the upper and lower threshold boundaries allows for a stuff bit to be leaked out over a different amount of time given the same initial conditions. Tighter threshold values relative to an initial elastic store bias value 95, may be imposed on those elastic store units which are to have smoother output characteristics, especially for high speed dedicated data line and video applications which may have tighter toleranced jitter generation characteristics.

In operation, jitter accumulator 26 receives write address information 34 from elastic store unit 12 that includes the settings of write bit counter 42, write address generator 52 and write roll controller 59. Jitter accumulator 26 also receives retimed read address information 32 from elastic store unit 12 that includes the settings of read bit counter 56 and read address generator 58. Summer 80 performs a comparison by subtracting retimed read address information 32 from write address information 34. Summer 82 receives the address comparison from summer 80 and performs a comparison by subtracting initial elastic store bias value 95 from the address comparison. Initial elastic store bias value 95 is the nominal fill value of storage memory 50 within elastic store unit 12. Summer 84 receives an output result from summer 82 and adds the output result to the jitter value already within jitter storage memory 90 as held by jitter output register 92 for the appropriate elastic store unit 12. The jitter value within jitter storage memory 90 is either a base line value or a previous jitter sum as determined by multiplexer 86. Summer 84 generates accumulated jitter signal 78 that is compared to lower threshold signal 72 at first comparator 70 and upper threshold signal 76 at second comparator 74.

If accumulated jitter signal 78 falls below lower threshold signal 72, first comparator 70 asserts a slow down signal 30 to digitally controlled oscillator 24 in order to adjust output clock signal 22 by dividing reference clock signal 36 by a slow down factor, in this instance a factor of 17. If accumulated jitter signal 78 exceeds upper threshold signal 76, second comparator 74 asserts speed up signal 28 to digitally controlled oscillator 24 in order to adjust output clock signal 22 by dividing reference clock signal 36 by a speed up factor, in this instance a factor of 15. If accumulated jitter signal 78 falls within the range established by lower threshold signal 72 and upper threshold signal 76, neither speed up signal 28 nor slow down signal 30 are asserted and output clock signal 22 is generated by dividing reference clock signal 36 by a nominal factor, in this instance a factor of 16. Accumulated jitter signal 78 sums slower when action is taken by speed up signal 28 or slow down signal 30, because the fill level of storage unit 50 is becoming corrected. This gives rise to a logarithmic frequency response of output clock signal 22.

If accumulated jitter signal 78 falls within the boundary established by lower threshold signal 72 and upper threshold signal 76, multiplexer 86 ensures that the value of accumulated jitter signal 78 is placed into jitter storage memory 90 through jitter input register 88. The next time a comparison is made with this particular elastic store unit 12, the newly stored value within jitter storage memory 90 will be used to generate a new accumulated jitter signal 78. If accumulated jitter signal 78 lies outside the boundary established by lower threshold signal 72 or upper threshold signal 76, multiplexer 86 will set a select signal 94 to the base line value in response to either speed up signal 28 or slow down signal 30.

Figure 4A:
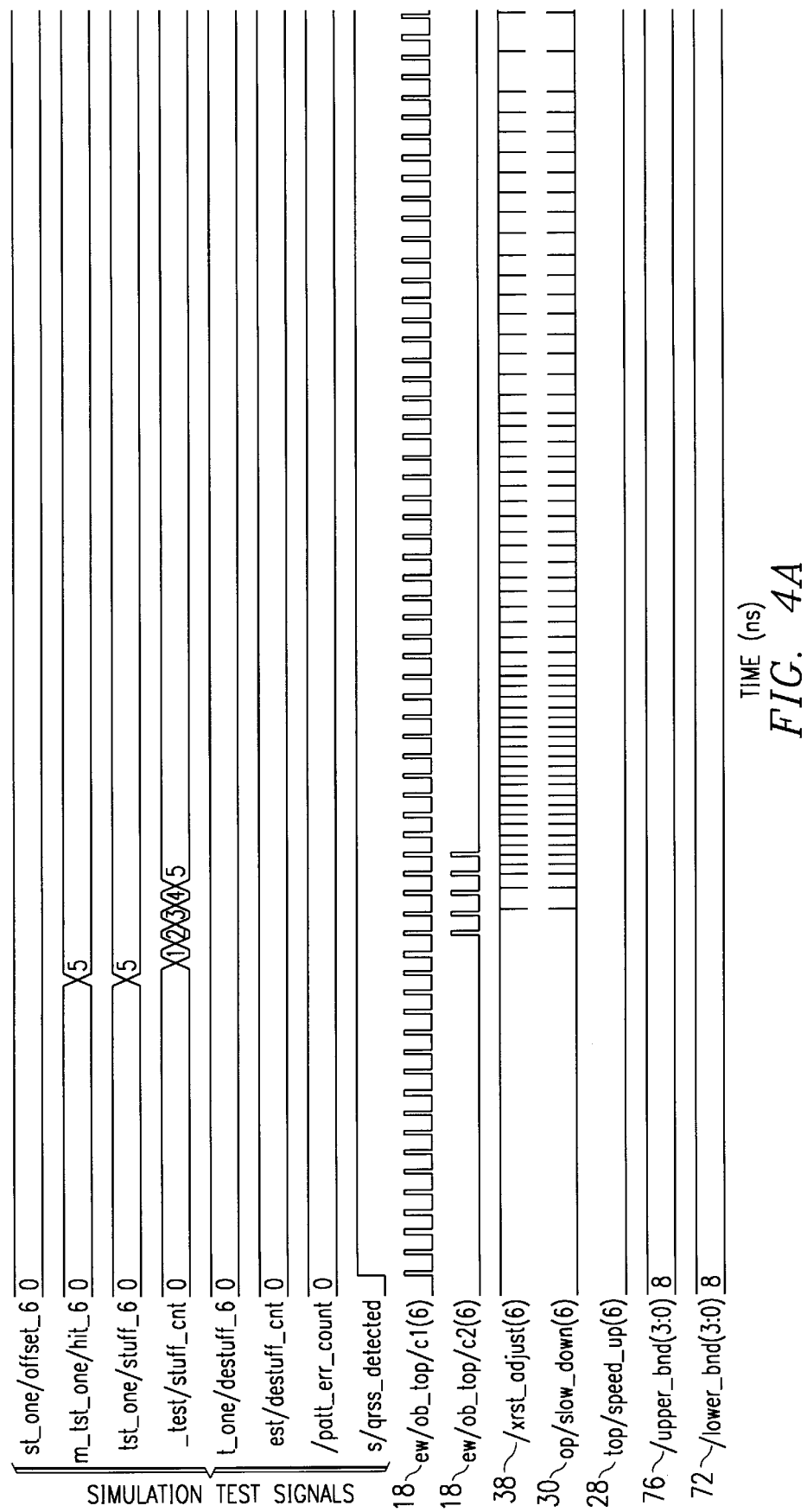
FIGS. 4A–C illustrate timing characteristics for the digital desynchronizer.
Figure 4B:
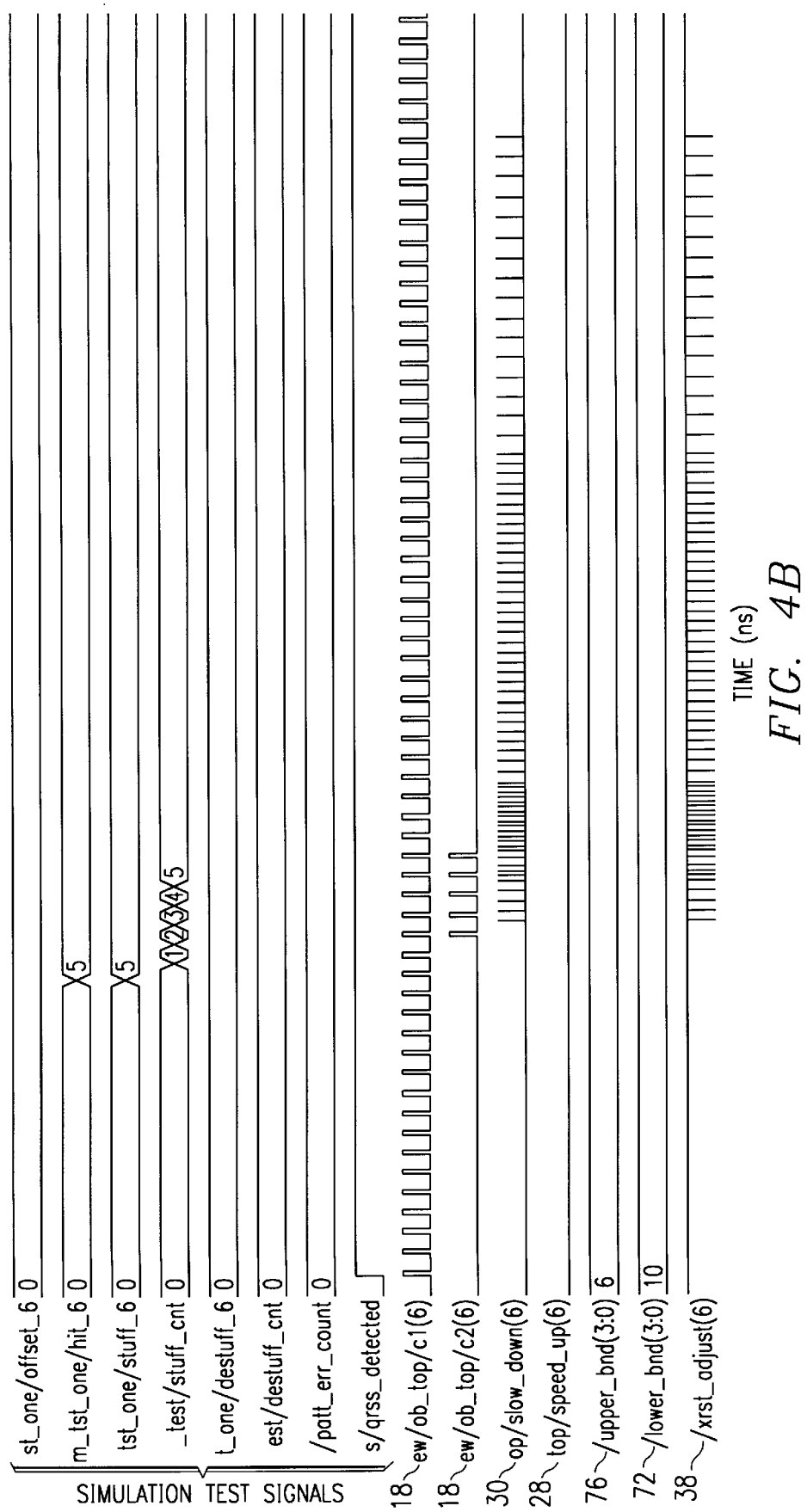
Figure 4C:
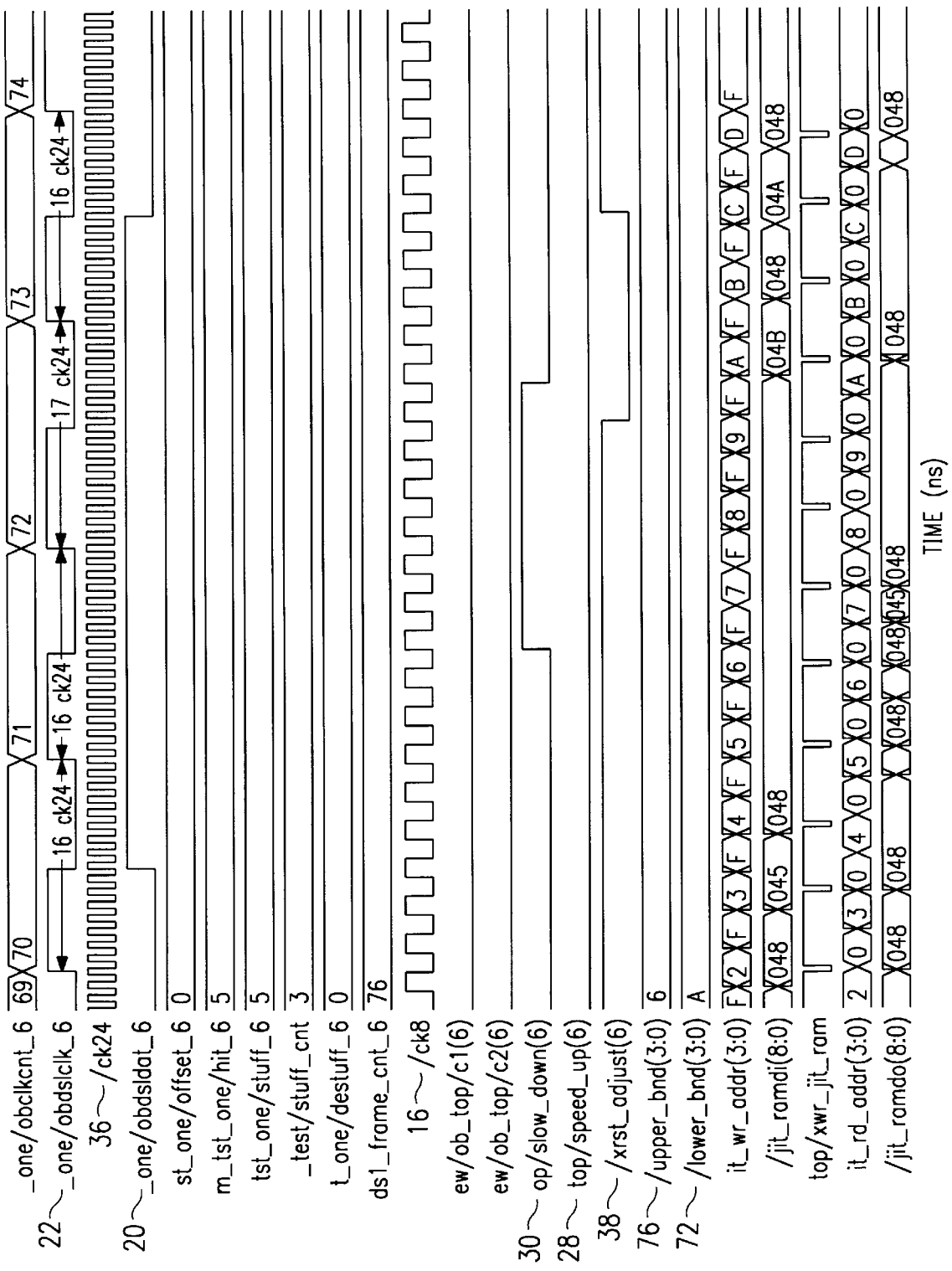

FIGS. 4A–C show timing characteristics for digital desynchronizer 10 illustrating the programmable logarithmic frequency response of the asynchronous output data. FIG. 4A shows the assertion of slow down signal 30 for an upper threshold level of 80 and a lower threshold level of 64 for a five stuff bit example. The simulation tracks timing signals 18, slow down signal 30, speed up signal 28, upper threshold signal 76, lower threshold signal 72, and reset signal 38. The simulation readily shows through slow down signal 30, the logarithmic frequency response applied to the asynchronous output data.

FIG. 4B shows the programmable nature of digital desynchronizer 10. Slow down signal 30 is asserted for an upper threshold level of 76 and lower threshold level of 68 for the same five stuff bit example. The logarithmic frequency response of the asynchronous output data provided through slow down signal 30 changes with different upper and lower threshold levels. Thus, the logarithmic frequency response can be tailored for specific design requirements.

FIG. 4C shows the effect slow down signal 30 has on output clock signal 22. When slow down signal 30 is not asserted, reference clock signal 36 is divided by the nominal factor, in this case a factor of 16. One full clock pulse of output clock signal 22 consists of sixteen full clock pulses of reference clock signal 36. When slow down signal 30 is asserted, reference clock signal 36 is divided by the slow down factor, in this case a factor of 17. One full clock pulse of output clock signal 22 now consists of seventeen full clock pulses of reference clock signal 36.

In summary, this digital desynchronizer generates an output clock signal with a programmable logarithmically integrated frequency response. The logarithmic frequency response of the output signal is controlled by a jitter accumulator. The jitter accumulator compares read and write address information of an elastic store unit from the memory fill level of the elastic store unit. The jitter accumulator determines whether this comparison falls above or below dynamically programmable threshold levels. If the comparison exceeds the dynamically programmable upper threshold level, then the jitter accumulator asserts a speed up signal to a digitally controlled oscillator that adjusts the output control signal by dividing a reference clock signal with a speed up factor. If the comparison falls below the dynamically programmable lower threshold level, then the jitter accumulator asserts a slow down signal to the digitally controlled oscillator to adjust the output clock signal by dividing the reference clock signal with a slow down factor. If the comparison falls within the threshold range, the jitter accumulator does not assert either control signal and the digitally controlled oscillator generates the output clock signal by dividing the reference clock signal with a nominal factor. The upper and lower boundaries of the threshold range are programmable in order to vary the smoothness of the frequency response of the output clock signal and to provide for changes (tightening) in required standards.

Thus, it is apparent that there has been provided, in accordance with the present invention, a digital desynchronizer and method that satisfies the advantages set forth above. Although the present invention has been described in detail, it should be understood that various changes, substitutions, and alterations can be made herein. For example, though specific clock frequencies and dividing factors have been shown and described, other reference clock frequencies and dividing factors may be used with equal effectiveness. Additionally, the number of desynchronizers controlled by the lone jitter accumulator can easily be increased or decreased. Storage methods for the elastic store unit or the jitter accumulator storage unit can be other than dual-port SRAM's. Other examples are readily ascertainable by one skilled in the art and may be made without departing from the spirit and scope of the present invention as defined by the following claims.

What is claimed is:

1. A digital desynchronizer, comprising:
    an elastic store unit operable to receive synchronously mapped asynchronous data on a synchronous data bus;
    a digitally controlled oscillator operable to generate an output clock signal, the elastic store unit operable to generate asynchronous output data from the synchronously mapped asynchronous data in response to the output clock signal;
    a programmable jitter accumulator operable to generate a jitter control signal, the jitter control signal operable to adjust a clock rate of the output clock signal such that the asynchronous output data from the elastic store unit has a programmable logarithmic frequency response, wherein the digitally controlled oscillator generates a reset signal after adjusting the clock rate of the output clock signal, the jitter control signal returning to a de-asserted level in response to the reset signal.

2. A method of desynchronizing synchronously mapped asynchronous data, comprising the steps of:
    storing synchronously mapped asynchronous data in a memory;
    establishing a dynamically programmable threshold range having an upper level and a lower level;

determining a jitter sum from an amount of synchronously mapped asynchronous data stored in the memory;

comparing the jitter sum to the dynamically programmable threshold range;

generating a jitter control signal in response to the jitter sum falling outside the upper level or lower level of the threshold range;

providing an output clock signal to asynchronously transfer the synchronously mapped asynchronous data from the memory;

adjusting the rate of the output clock signal in response to the jitter control signal;

generating a reset signal to de-assert the jitter control signal after adjusting the rate of the output clock signal.

3. A digital desynchronizer, comprising:

an elastic store unit operable to receive synchronously mapped asynchronous data on a synchronous data bus;

a digitally controlled oscillator operable to generate an output clock signal, the elastic store unit operable to generate asynchronous output data from the synchronously mapped asynchronous data in response to the output clock signal;

a programmable jitter accumulator operable to generate a jitter control signal, the jitter control signal operable to adjust a clock rate of the output clock signal such that the asynchronous output data from the elastic store unit has a programmable logarithmic frequency response, wherein the programmable jitter accumulator determines a jitter sum from the low frequency jitter components due to the unmapping of synchronously mapped asynchronous data, the programmable jitter accumulator generating the jitter control signal in response to exceeding a programmable threshold by the value of the jitter sum, wherein the programmable jitter accumulator compares retimed read address information of the elastic store unit to write address information of the elastic store unit minus an initial elastic store bias, the comparison added to a previous jitter sum or to a baseline value according to the jitter control signal in order to generate the jitter sum.

4. The digital desynchronizer of claim 3, wherein the low frequency jitter components include an incoming service offset component, a wander component, and a jitter component of the synchronously mapped asynchronous data.

5. The digital desynchronizer of claim 3, wherein the jitter control signal is a speed up command to increase the clock rate of the output clock signal.

6. The digital desynchronizer of claim 5, wherein the clock rate of the output clock signal is adjusted by a speed up factor of fifteen.

7. The digital desynchronizer of claim 3, wherein the jitter control signal is a slow down command to decrease the clock rate of the output clock signal.

8. The digital desynchronizer of claim 7, wherein the clock rate of the output clock signal is adjusted by a slow down factor of seventeen.

9. The digital desynchronizer of claim 3, wherein the jitter accumulator compares the jitter sum to a programmable threshold range, the threshold range having programmable upper and lower limits to adjust the logarithmic frequency response of the asynchronous output data.

10. A method of desynchronizing synchronously mapped asynchronous data, comprising the steps of:

storing synchronously mapped asynchronous data in a memory;

establishing a dynamically programmable threshold range having an upper level and a lower level;

determining a jitter sum from an amount of synchronously mapped asynchronous data stored in the memory, the jitter sum determined by combining a current fill level of the memory with either a previous jitter sum or a baseline value;

comparing the jitter sum to the dynamically programmable threshold range;

generating a jitter control signal in response to the jitter sum falling outside the upper level or lower level of the threshold range, the jitter control signal determining whether the previous jitter sum or the baseline value is combined with the current fill level of the memory;

providing an output clock signal to asynchronously transfer the synchronously mapped asynchronous data from the memory;

adjusting the rate of the output clock signal in response to the jitter control signal.

11. The method of claim 10, wherein the jitter control signal increases the rate of the output clock signal in response to the jitter sum being above the upper level of the threshold range.

12. The method of claim 10, wherein the jitter control signal decreases the rate of the output clock signal in response to the jitter sum being below the lower level of the threshold range.

13. The method of claim 10, further comprising the step of:

setting of the upper level and the lower level such that the asynchronously transferred data from the memory has a programmable logarithmically integrated frequency response.

14. A digital desynchronizer, comprising:

an elastic store unit operable to receive and store synchronously mapped asynchronous data;

a digitally controlled oscillator operable to generate an output clock signal, the elastic store unit operable to provide asynchronous output data from the synchronously mapped asynchronous data in response to the output clock signal;

a programmable jitter accumulator operable to determine a jitter sum in response to retimed read address information and write address information provided by the elastic store unit, the programmable jitter accumulator operable to compare the jitter sum to a programmable threshold range having an upper level and a lower level, the programmable jitter accumulator operable to generate and assert upper and lower jitter control signals in response to the jitter sum being outside the upper and lower levels respectively of the threshold range, the digitally controlled oscillator operable to adjust a clock rate of the output clock signal in response to either of the jitter control signals such that the asynchronous output data provided by the elastic store unit has a programmable logarithmically integrated frequency response, wherein the upper and lower levels of the threshold range are programmable in order to adjust the logarithmically integrated frequency response of the asynchronous output data, wherein the digitally controlled oscillator generates a reset signal operable to de-assert either of the jitter control signals.

15. A digital desynchronizer, comprising:

an elastic store unit operable to receive and store synchronously mapped asynchronous data;

a digitally controlled oscillator operable to generate an output clock signal, the elastic store unit operable to provide asynchronous output data from the synchronously mapped asynchronous data in response to the output clock signal;

a programmable jitter accumulator operable to determine a jitter sum in response to retimed read address information and write address information provided by the elastic store unit, the programmable jitter accumulator operable to compare the jitter sum to a programmable threshold range having an upper level and a lower level, the programmable jitter accumulator operable to generate and assert upper and lower jitter control signals in response to the jitter sum being outside the upper and lower levels respectively of the threshold range, the digitally controlled oscillator operable to adjust a clock rate of the output clock signal in response to either of the jitter control signals such that the asynchronous output data provided by the elastic store unit has a programmable logarithmically integrated frequency response, wherein the upper and lower levels of the threshold range are programmable in order to adjust the logarithmically integrated frequency response of the asynchronous output data, wherein the jitter sum is included in a next jitter sum value when the jitter sum falls within the upper and lower levels of the threshold range.

16. A digital desynchronizer, comprising:

an elastic store unit operable to receive and store synchronously mapped asynchronous data;

a digitally controlled oscillator operable to generate an output clock signal, the elastic store unit operable to provide asynchronous output data from the synchronously mapped asynchronous data in response to the output clock signal;

a programmable jitter accumulator operable to determine a jitter sum in response to retimed read address information and write address information provided by the elastic store unit, the programmable jitter accumulator operable to combine a current fill level of the elastic store unit with either a previous jitter sum or a baseline value to determine the jitter sum, the programmable jitter accumulator operable to compare the jitter sum to a programmable threshold range having an upper level and a lower level, the programmable jitter accumulator operable to generate and assert upper and lower jitter control signals in response to the jitter sum being outside the upper and lower levels respectively of the threshold range, the upper and lower jitter control signals determining whether the previous jitter sum or the baseline value is to be combined with the current fill level of the elastic store unit, the digitally controlled oscillator operable to adjust a clock rate of the output clock signal in response to either of the jitter control signals such that the asynchronous output data provided by the elastic store unit has a programmable logarithmically integrated frequency response, wherein the upper and lower levels of the threshold range are programmable in order to adjust the logarithmically integrated frequency response of the asynchronous output data.

17. The digital desynchronizer of claim 16, wherein the upper jitter control signal causes the digitally controlled oscillator to adjust the clock rate of the output clock signal by a speed up factor in response to the jitter sum exceeding the programmable upper level of the threshold range.

18. The digital desynchronizer of claim 16, wherein the lower jitter control signal causes the digitally controlled oscillator to adjust the clock rate of the output clock signal by a slow down factor in response to the jitter sum falling below the programmable lower level of the threshold range.

\* \* \* \* \*